(12) United States Patent
Imada et al.

(10) Patent No.: US 7,928,536 B2
(45) Date of Patent: Apr. 19, 2011

(54) ROUGHNESS REDUCING FILM AT INTERFACE, MATERIALS FOR FORMING ROUGHNESS REDUCING FILM AT INTERFACE, WIRING LAYER AND SEMICONDUCTOR DEVICE USING THE SAME, AND METHOD FOR MANUFACTURING SEMICONDUCTOR DEVICE

(75) Inventors: Tadahiro Imada, Kawasaki (JP); Yoshihiro Nakata, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 219 days.

(21) Appl. No.: 11/727,001

(22) Filed: Mar. 23, 2007

(65) Prior Publication Data
US 2007/0232075 A1 Oct. 4, 2007

(30) Foreign Application Priority Data

Mar. 29, 2006 (JP) .................................. 2006-091549
Dec. 26, 2006 (JP) .................................. 2006-349409

(51) Int. Cl.
*H01L 21/31* (2006.01)
(52) U.S. Cl. ................................ 257/632; 257/E21.242
(58) Field of Classification Search .................. 438/637, 438/640, 780; 257/632
See application file for complete search history.

(56) References Cited

U.S. PATENT DOCUMENTS

| 6,541,842 | B2 | 4/2003 | Meynen et al. | |
|---|---|---|---|---|
| 2002/0055256 | A1* | 5/2002 | Jiang | 438/687 |
| 2004/0077757 | A1* | 4/2004 | Araki et al. | 524/264 |
| 2004/0109950 | A1* | 6/2004 | Adams et al. | 427/387 |
| 2005/0239278 | A1 | 10/2005 | Li et al. | |
| 2006/0199376 | A1 | 9/2006 | Deguchi | |
| 2006/0204651 | A1* | 9/2006 | Wai et al. | 427/97.7 |

FOREIGN PATENT DOCUMENTS

| JP | 6-267946 A | 9/1994 |
|---|---|---|
| JP | 2004-511896 A | 4/2004 |
| JP | 2004-513503 A | 4/2004 |
| JP | 2004-292304 A | 10/2004 |
| WO | WO 00/44036 A1 | 7/2000 |
| WO | WO 02/01621 A2 | 1/2002 |
| WO | WO 02/071476 A2 | 9/2002 |
| WO | WO 02/071476 A3 | 9/2002 |

OTHER PUBLICATIONS

European Search Report dated Jul. 24, 2007, issued in corresponding European Application No. EP 07 00 5824.
Chinese Office Action dated Sep. 26, 2008, issued in corresponding Chinese Patent Application No. 200710089088.9.

* cited by examiner

*Primary Examiner* — Alexander G Ghyka
(74) *Attorney, Agent, or Firm* — Westerman, Hattori, Daniels & Adrian, LLP

(57) ABSTRACT

Techniques for obtaining a wiring layer with a high TDDB resistance and little leakage current, and accordingly, for manufacturing a highly reliable semiconductor device with a small electric power consumption are provided, in which an interfacial roughness reducing film is formed which is in contact with an insulator film and also in contact with a wiring line on the other side surface thereof, and has an interfacial roughness between the wiring line and the interfacial roughness reducing film smaller than that between the insulator film and the interfacial roughness reducing film.

4 Claims, 11 Drawing Sheets

STEP 1

STEP 2

STEP 3

STEP 4

STEP 5

STEP 6

STEP 7

STEP 8

STEP 9

STEP 13

STEP 14

STEP 15

STEP 16

STEP 18

ROUGHNESS REDUCING FILM AT INTERFACE, MATERIALS FOR FORMING ROUGHNESS REDUCING FILM AT INTERFACE, WIRING LAYER AND SEMICONDUCTOR DEVICE USING THE SAME, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2006-091549, filed on Mar. 29, 2006, and the prior Japanese Patent Application No. 2006-349409, filed on Dec. 26, 2006, the entire contents of which are incorporated herein by reference.

BACKGROUND OF THE INVENTION

1. Field of the Invention

The present invention relates to a technology to absorb the interfacial roughness at the interface between an insulator film and a wiring line of a semiconductor device, or the like.

2. Description of the Related Art

While increase of electric power consumption in a semiconductor device due to leakage current into an insulator film for a wiring layer has been known, effect of the leakage on a whole device was small in the generations when the distance between two wiring lines of a semiconductor device exceeded 1 μm. However, when the distance between two wiring lines is not more than 1 μm, effect on the electric power consumption will be larger due to the smaller distance between two wiring lines and increase of the wiring scale, and particularly when circuits are formed with a distance between two wiring lines of not more than 0.1 μm as will be expected, such leakage current between two wiring lines will greatly influence the properties and life of a device.

Currently, the damascene method is employed for forming wiring lines in a semiconductor device wherein grooves in the shape of the wiring lines are first formed in an insulator film by etching, and copper wiring lines are formed there through plating. However, since the insulator film is inevitably damaged during the etching of the damascene method, increase of leakage caused by the damage inside the insulator film, degradation in the TDDB (time-dependent dielectric breakdown) properties due to the roughness of the surface of the grooves for wiring, etc. will occur, significantly causing the degradation in the yield and reliability in the manufacture of semiconductor devices.

Under these circumstances, it is needed to restrain generation of the damage during the etching for forming grooves for wiring (or wiring grooves), to perform surface treatment so as to decrease the leakage after the etching, or the like.

As a surface treatment to suppress the etching damage, a treatment to make the grooves for wiring after etching hydrophobic is in practice. For example, it is possible to decrease the amount of water adsorbed to the surface which is caused by the etching damage, and accordingly, suppress degradation of properties such as increase of dielectric constant due to water, when a method to make hydrophobic the surface of a silica type coating film after etching, or like is employed {see Japanese Unexamined Patent Application Publication Nos. H6-267946 (claims), 2004-511896 (claims), 2004-513503 (claims) and 2004-292304 (claims)}.

SUMMARY OF THE INVENTION

However it has been found that the reliability tests such as a TDDB test did not provide necessary properties when the above-described method was employed, and therefore further improvement is needed to improve the reliability.

Accordingly, it is an object of the present invention to solve the above-described problems and to provide techniques to solve the problem of influence due to damage caused during the etching for forming wiring grooves. Other objects and advantages of the invention will become more apparent from the following detailed description.

According to one aspect of the present invention, a roughness reducing at an interface is provided which is in contact with an insulator film and also in contact with a wiring line on the other side surface thereof, wherein the interfacial roughness between the wiring line and the interfacial roughness reducing film is smaller than that between the insulator film and the interfacial roughness reducing film.

Preferred are that the interfacial roughness reducing film has been installed after a treatment that is accompanied by surface roughening of the insulator film; that the interfacial roughness reducing film comprises silicon, and further, at least one of oxygen and carbon; that the interfacial roughness reducing film comprises at least one of an SiO skeleton and SiC skeleton; that the interfacial roughness reducing film has an average film thickness of 0.1-50 nm; that the insulator film is a low dielectric constant insulator film having a relative dielectric constant of 2.7 or less; and particularly that the insulator film is a low dielectric constant insulator film having a relative dielectric constant of 2.5 or less.

Using the interfacial roughness reducing film according to this aspect of the present invention, a wiring layer with a high TDDB resistance and little leakage current can be obtained, whereby a highly reliable semiconductor device with a small electric power consumption can be manufactured.

According to another aspect of the present invention, provided is a material for forming a roughness reducing film at an interface that is used for an interfacial roughness reducing film in contact with an insulator film and also in contact with a wiring line on the other side surface thereof, wherein the interfacial roughness between the wiring line and the interfacial roughness reducing film is smaller than that between the insulator film and the interfacial roughness reducing film, the material comprising a silicon compound that satisfies at least one of a condition of having an average molecular weight of not more than 1,000, and another condition of having 20 or less silicon atoms in a molecule.

Preferred are that the interfacial roughness reducing film has been installed after a treatment accompanied by surface roughening of the insulator film; that the silicon compound is selected from the group consisting of an organosilane, a hydrolysate of an organosilane, a condensate of an organosilane and a mixture thereof; that the material comprises a solvent that is the same as a component contained in a product obtained by hydrolyzing the organosilane; that the total amount of the organosilane, hydrolysate of an organosilane and condensate of an organosilane is not more than 5% by mass in the material; that the organosilane is represented by any of the following formulae (1) to (4), and (1'),

 (1)

 (2)

 (3)

 (4)

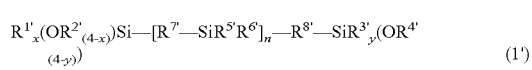 (1')

(in formulae (1) to (4), $R^1$-$R^{10}$ are, each independently, a group selected from the group consisting of an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20, and in formulae (1') $R^{1'}$-$R^{6'}$ are, each independently, a group selected from the group consisting of hydrogen, an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20, R7' and R8' are, each independently, a hydrocarbon group having a carbon number of 1 to 20, n is an integer of 0 to 18, and x and y are each independently, an integer of 0 to 4); and particularly that $R^1$-$R^{10}$ in formulae (1) to (4) are, each independently, a group selected from the group consisting of an alkyl group having a carbon number of 1 to 3, an alkenyl group, an alkynyl group, and an alkylcarbonyl group having a carbon number of 2 to 4, an alkenylalkyl group and an alkynylalkyl group having a carbon number of 3 to 6, and an aryl group having a carbon number of 6 to 10, and $R^{1'}$-$R^{6'}$ in formula (1') are, each independently, a group selected from the group consisting of an alkyl group having a carbon number of 1 to 3; an alkenyl group, an alkynyl group, an alkylcarbonyl group having a carbon number of 2 to 4, an alkenylalkyl group and an alkynylalkyl group having a carbon number of 3 to 6; and an aryl group having a carbon number of 6 to 10, and R7' and R8' are, each independently, a hydrocarbon group having a carbon number of 1 to 3; and that the film has a pH in the range of 4 to 10 in the state of use.

Using the material for forming an interfacial roughness reducing film according to this aspect of the present invention, the above-described interfacial roughness reducing film can be desirably manufactured, and a wiring layer with a high TDDB resistance and little leakage current can be obtained, whereby a highly reliable semiconductor device with a small electric power consumption can be manufactured.

According to another aspect of the present invention, provided is a method for manufacturing a semiconductor device comprising: applying the above-described material for forming an interfacial roughness reducing film in contact with an insulator film of the semiconductor device; and then, forming an interfacial roughness reducing film by heating the semiconductor device at a temperature of from 80 to 500° C. for 0.5 to 180 minutes.

Preferred are that the insulator film has been subjected to a treatment accompanied by surface roughening; that the application is spin coating or vapor treating; that the average film thickness of the interfacial roughness reducing film is in the range of 0.1 to 50 nm; that the heat treatment after the application is carried out in an oxygen-less atmosphere; that the insulator film is at least either one of an interlayer insulation film and a protective layer for an interlayer insulation film, and the treatment accompanied by surface roughening is etching or CMP; that the insulator film is a low dielectric constant insulator film having a relative dielectric constant of 2.7 or less; particularly that the insulator film is a low dielectric constant insulator film having a relative dielectric constant of 2.5 or less; and that the insulator film is obtained by treatment comprising: applying to a substrate for processing a liquid composition comprising an organosilicon compound obtained by hydrolysis of one or more in combination of silane compounds represented by the following formulae (5) to (8), in the presence of tetraalkylammonium hydroxide; subjecting the coating film of the liquid composition applied onto the substrate for processing to a heat processing at a temperature not less than 80 and not more than 350° C.; and baking the coating film heated in the heat treatment at a temperature more than 350 and not more than 450° C.,

$$Si(OR^{11})_4 \tag{5}$$

$$X^1Si(OR^{12})_3 \tag{6}$$

$$X^2X^3Si(OR^{13})_2 \tag{7}$$

$$X^4X^5X^6SiOR^{14} \tag{8}$$

(in formulae (5) to (8), $X^1$-$X^6$ are, each independently, selected from the group consisting of a hydrogen atom, a fluorine atom, an alkyl group having a carbon number of 1 to 8, a fluorine-substituting alkyl group, an aryl group and a vinyl group; and $R^{11}$-$R^{14}$ are, each independently, a group selected from the group consisting of an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20.)

According to this aspect of the present invention, a highly reliable semiconductor device with a small electric power consumption can be manufactured.

According to the present invention, a wiring layer with a high TDDB resistance and little leakage current can be obtained, and thereby a highly reliable semiconductor device with a small electric power consumption can be manufactured.

DESCRIPTION OF THE PREFERRED EMBODIMENTS

Figure 1:
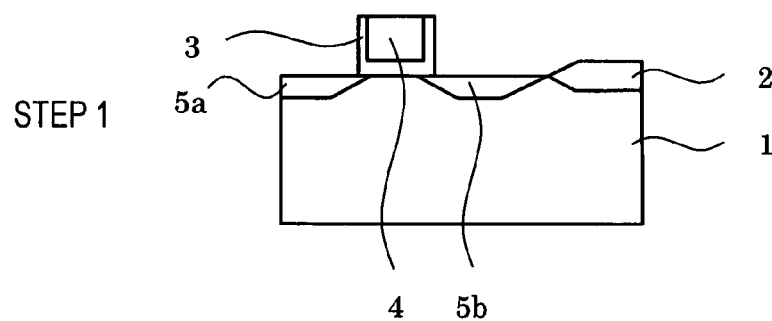
FIG. 1 is a schematic view (cross-sectional view) showing an example of a method for manufacturing a multilayer wiring structure according to the present invention.
Figure 1:
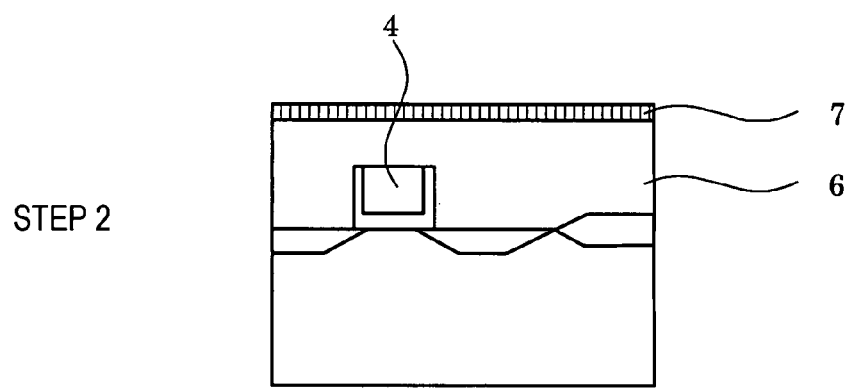
Figure 1:
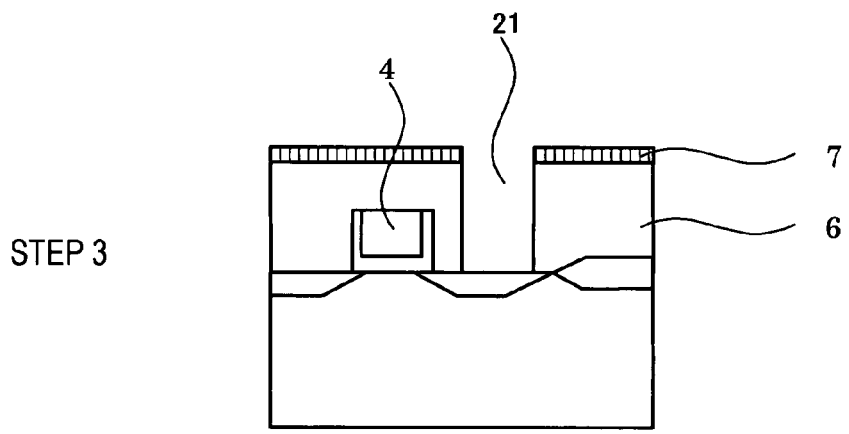
Figure 2:
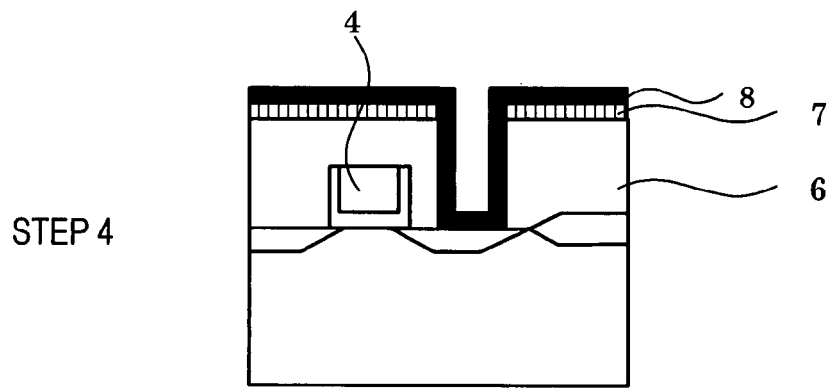
FIG. 2 is a schematic view (cross-sectional view) showing an example of a method for manufacturing a multilayer wiring structure according to the present invention.
Figure 2:
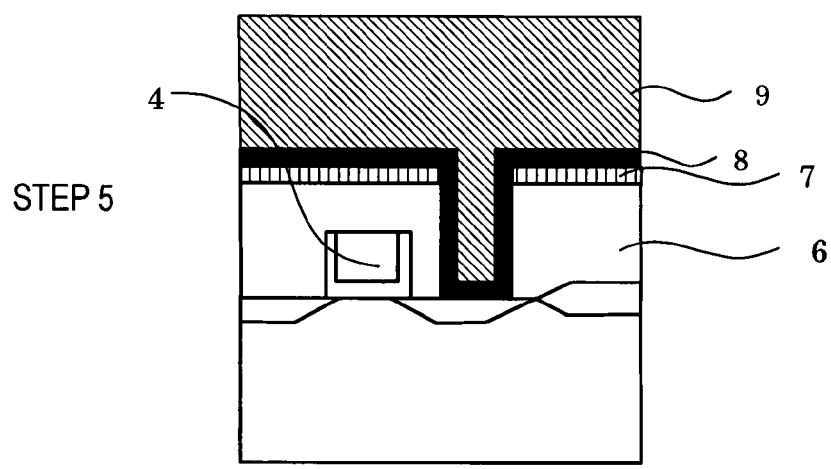
Figure 2:
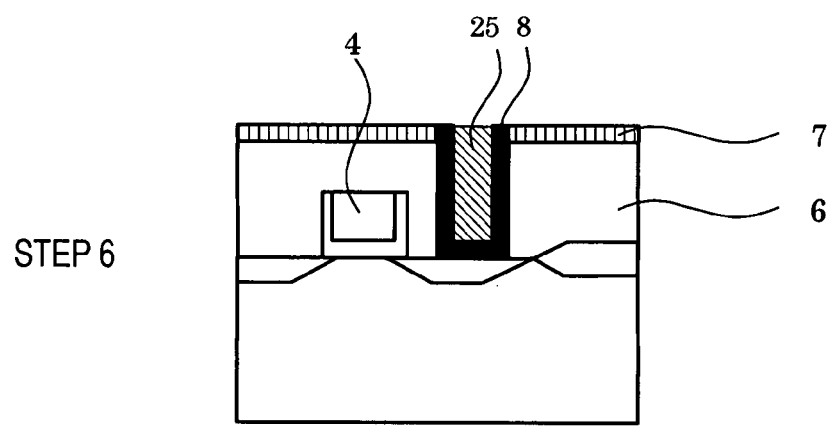
Figure 3:
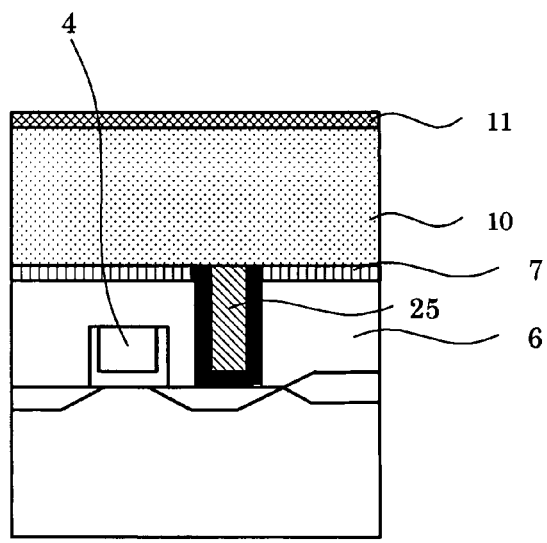
FIG. 3 is a schematic view (cross-sectional view) showing an example of a method for manufacturing a multilayer wiring structure according to the present invention.
Figure 3:
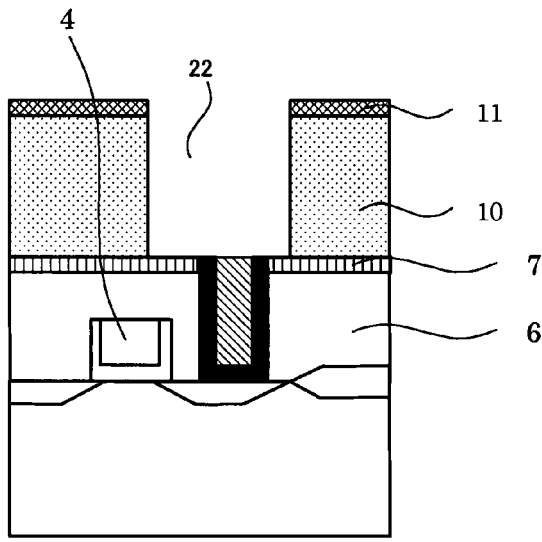
Figure 3:
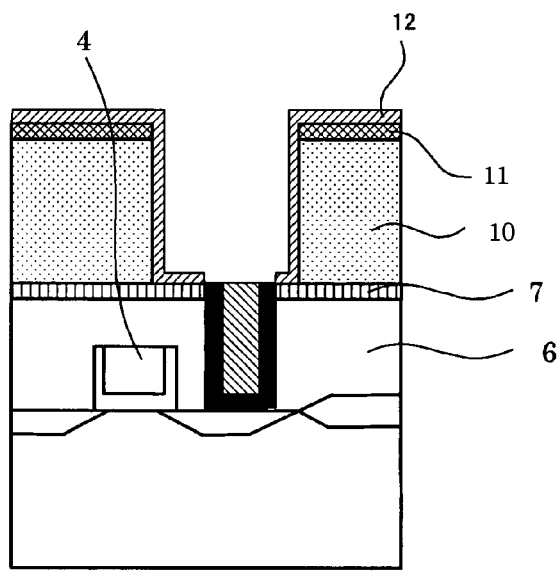
Figure 4:
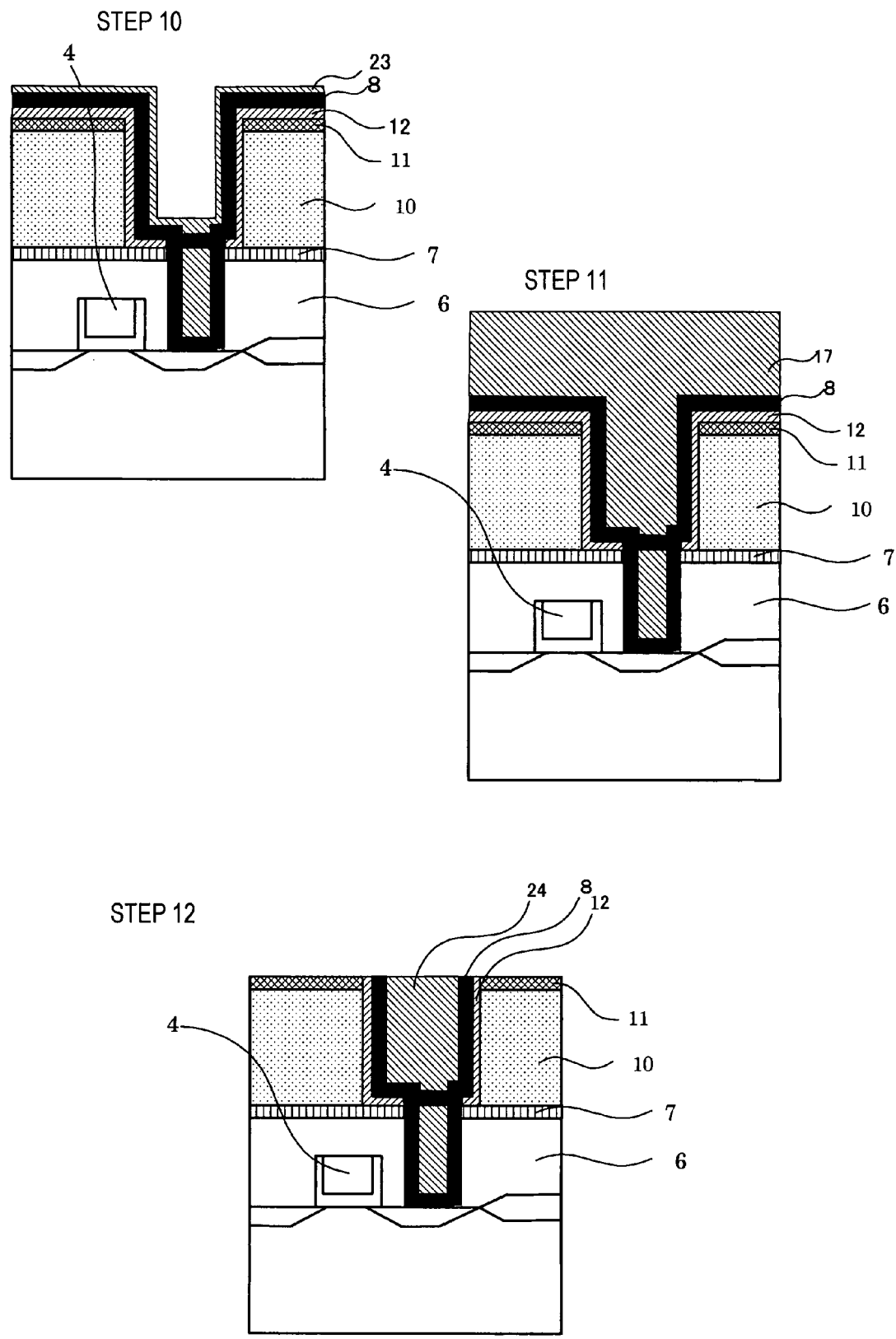
FIG. 4 is a schematic view (cross-sectional view) showing an example of a method for manufacturing a multilayer wiring structure according to the present invention.
Figure 5:
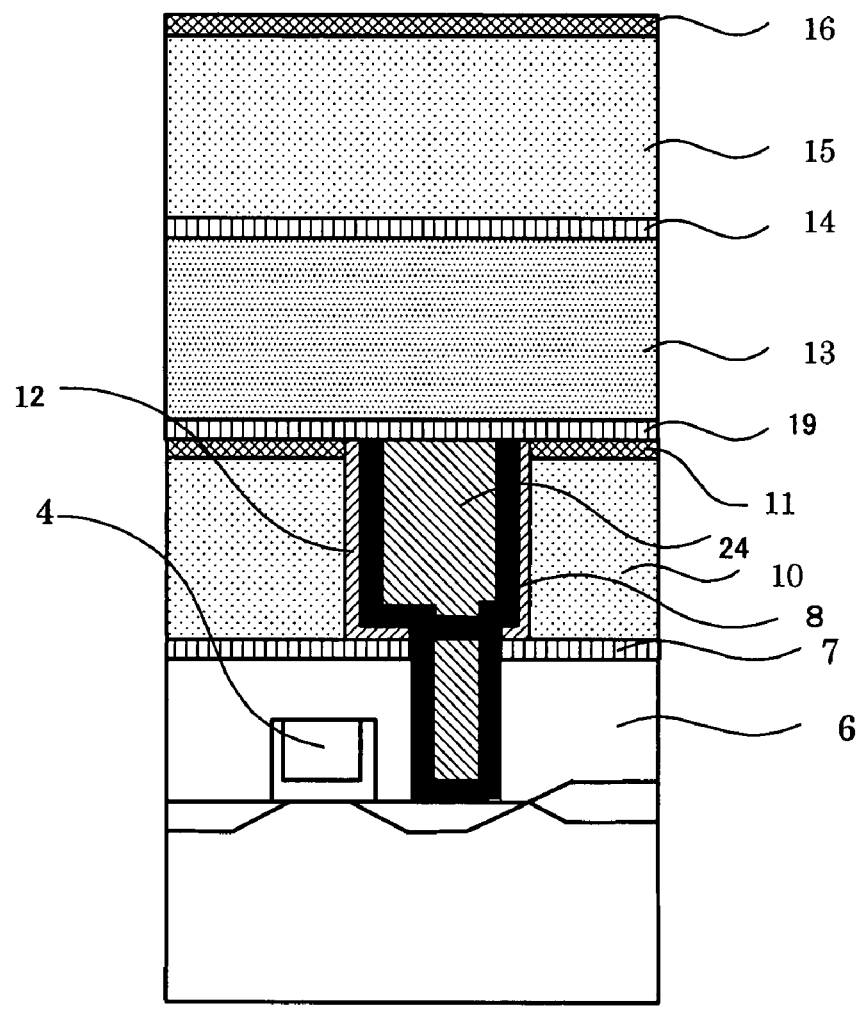
FIG. 5 is a schematic view (cross-sectional view) showing an example of a method for manufacturing a multilayer wiring structure according to the present invention.
Figure 6:
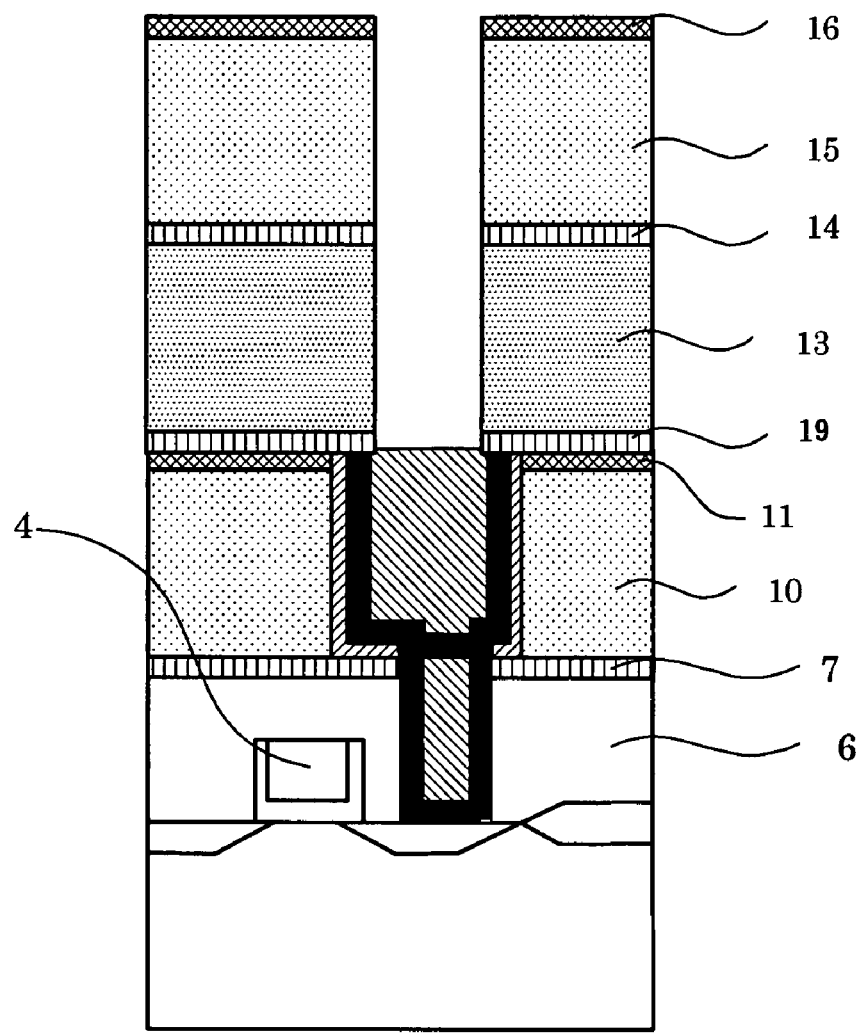
FIG. 6 is a schematic view (cross-sectional view) showing an example of a method for manufacturing a multilayer wiring structure according to the present invention.
Figure 7:
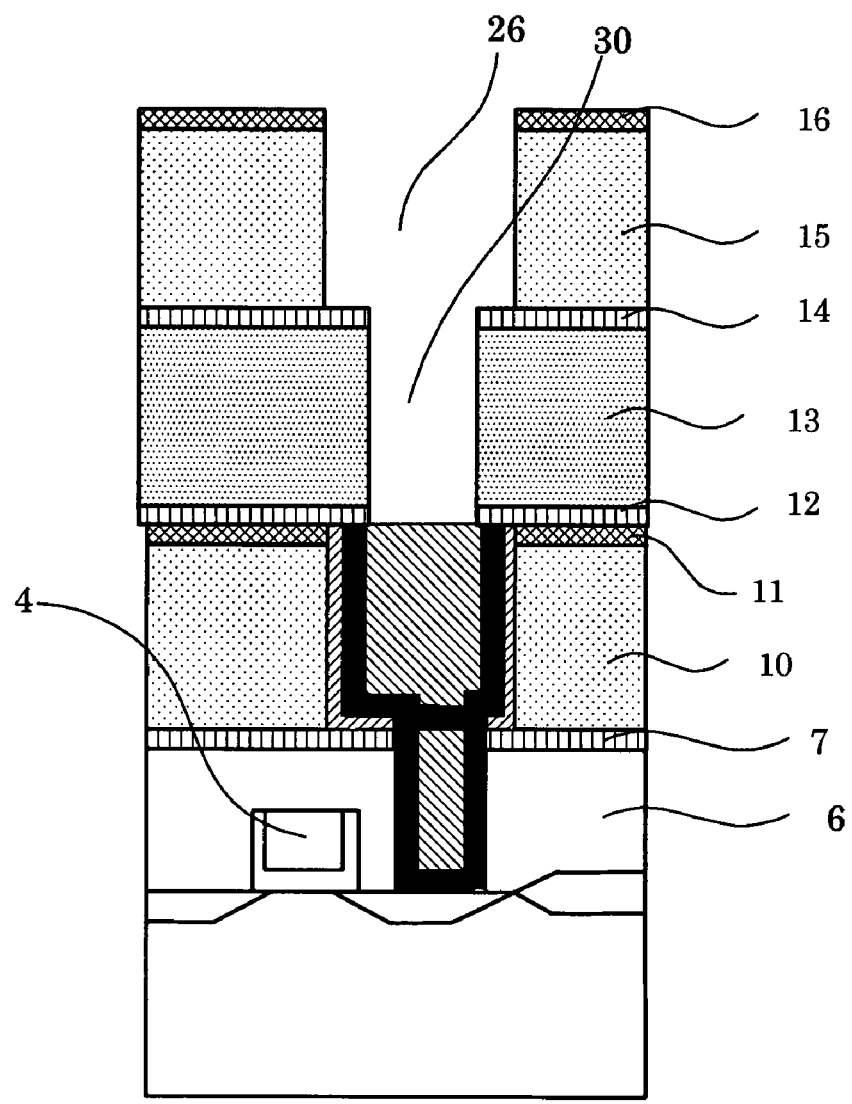
FIG. 7 is a schematic view (cross-sectional view) showing an example of a method for manufacturing a multilayer wiring structure according to the present invention.
Figure 8:
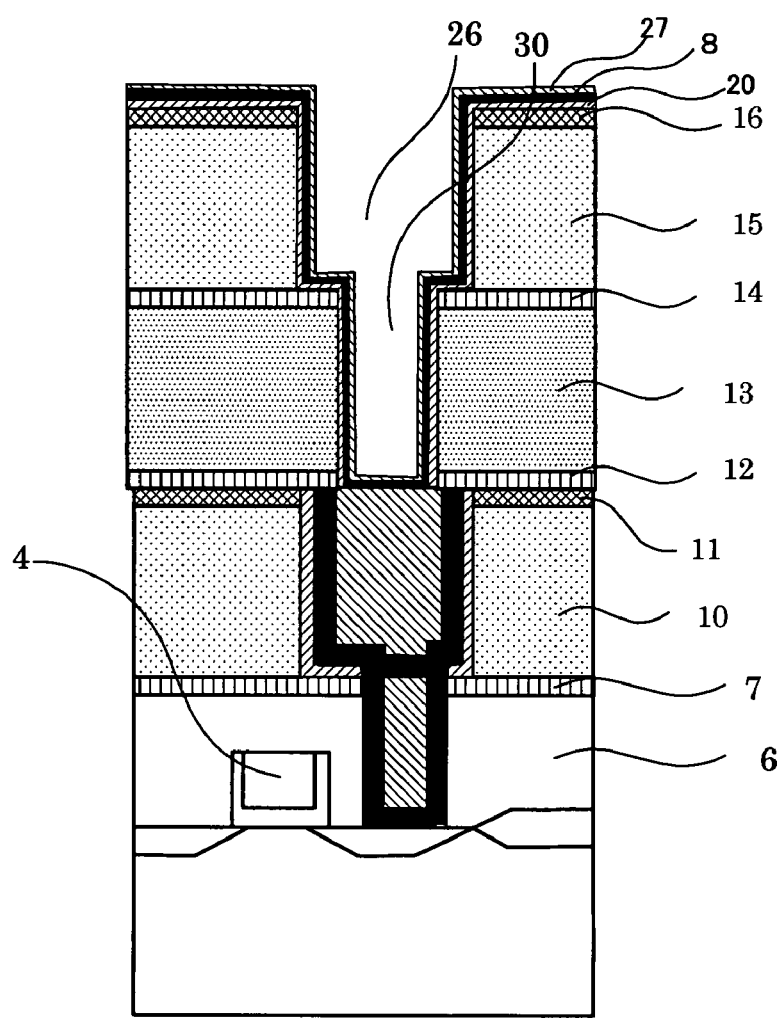
FIG. 8 is a schematic view (cross-sectional view) showing an example of a method for manufacturing a multilayer wiring structure according to the present invention.
Figure 9:
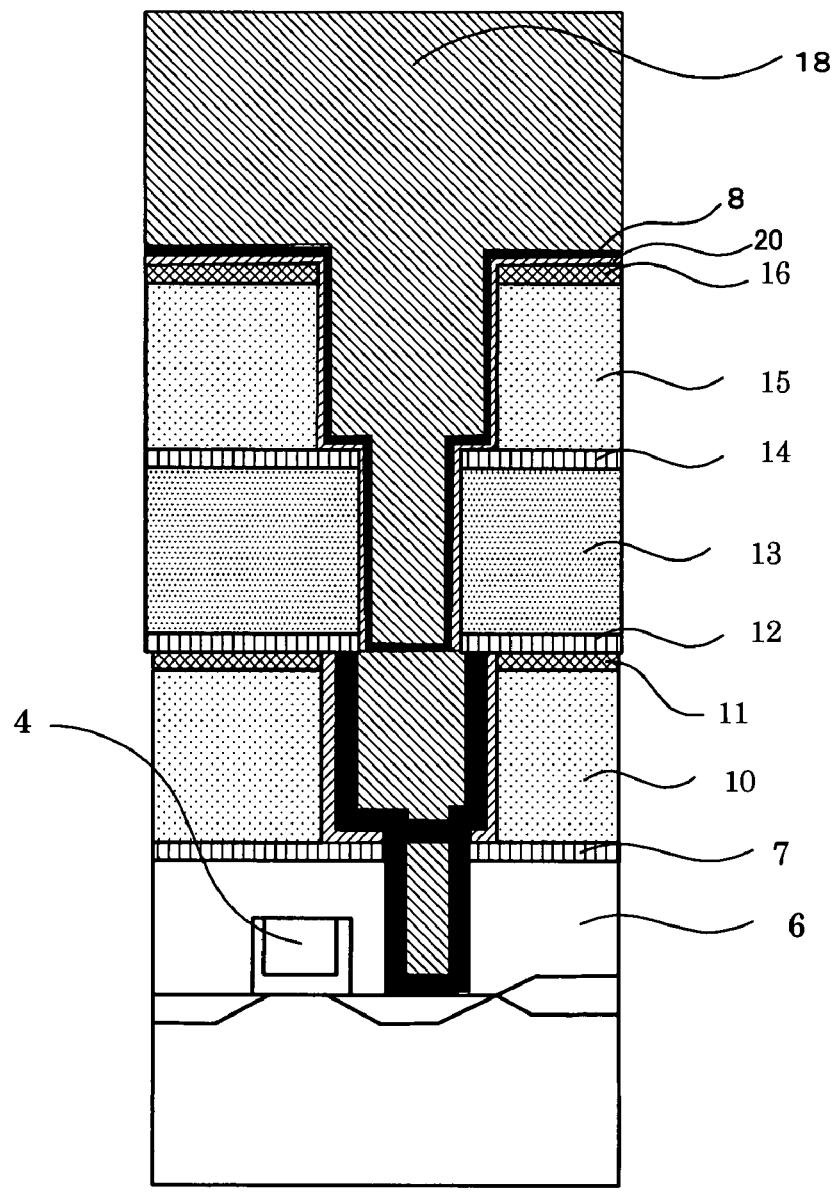
FIG. 9 is a schematic view (cross-sectional view) showing an example of a method for manufacturing a multilayer wiring structure according to the present invention.
Figure 10:
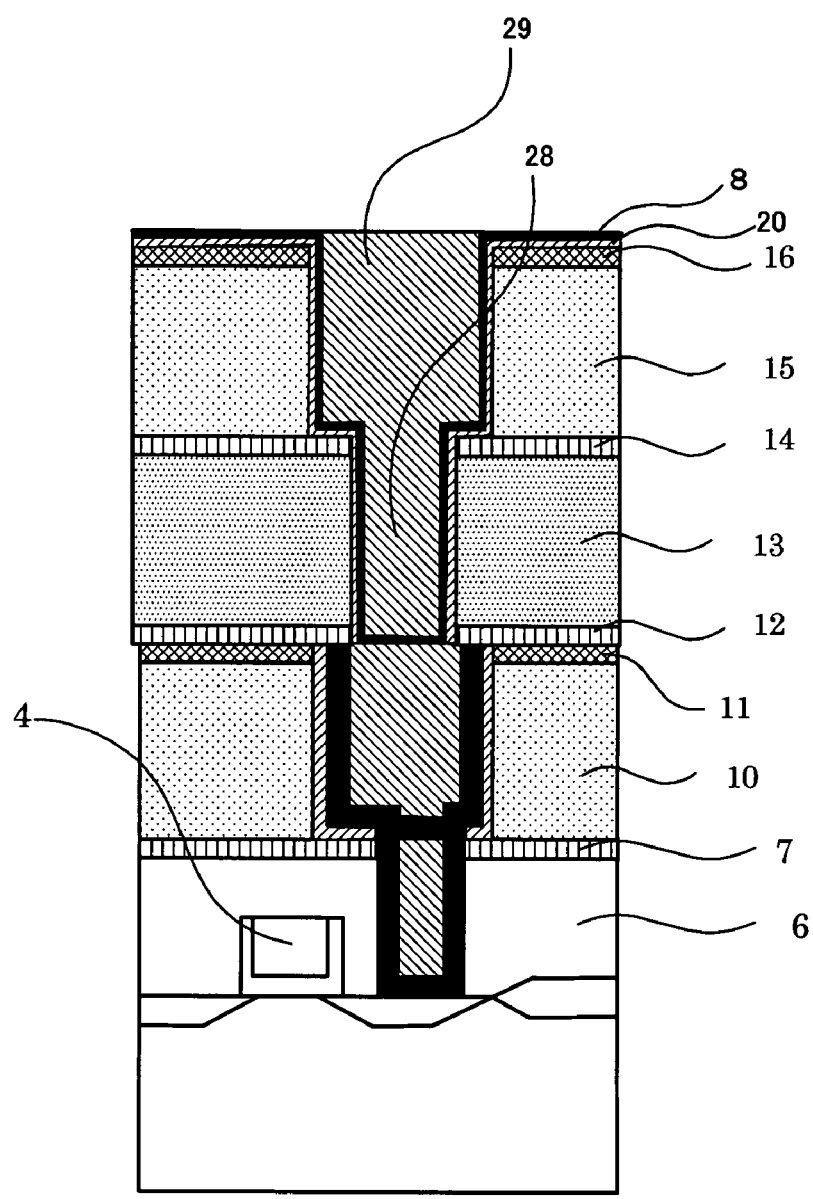
FIG. 10 is a schematic view (cross-sectional view) showing an example of a method for manufacturing a multilayer wiring structure according to the present invention.

Embodiments according to the present invention are explained below using figures, tables, examples and the like. These figures, tables, examples and the like as well as the explanations exemplify the present invention, and do not limit its scope. Other embodiments can of course fall within the scope according to the present invention to the extent that they match the intent according to the present invention. In the figures, the same numeral represents the same element.

In the present invention, a "roughness reducing film at and interface" or an "interfacial roughness reducing film" means a film in contact with a layer wherein to compare with the contacting surface with the layer (that is, interface), the surface or interface on the side which does not contact with the layer is smoother (that is, less roughened).

According to one aspect of the present invention, an interfacial roughness reducing film in contact with an insulator film and also in contact with a wiring line on the other side surface is installed. In this interfacial roughness reducing film, to compare the interfacial roughness between the insulator film and the interfacial roughness reducing film, the interfacial roughness between the wiring line and the interfacial roughness reducing film on the other side is smaller. Owing to the presence of such an interfacial roughness reducing film, it is possible to improve the reliability of a wiring layer containing such a wiring line. The roughness may be determined by any known method. Arithmetic average roughness Ra obtained through measurement using an AFM (atomic force microscope) from the surface image may be favorably employed.

In the present invention, an "interfacial roughness reducing film in contact with an insulator film and also in contact with a wiring line on the other side surface thereof" may include any spatial structure, only if it is a layer structure composed of an insulator film/interfacial roughness reducing film/wiring line in this order. For example, when it is installed in a semiconductor device, the surface of the interfacial roughness reducing film may be in parallel with the surface of the substrate of the semiconductor device, may be perpendicular to the surface, or may face any direction other than those.

When there is another layer between an insulator film and an interfacial roughness reducing films, the layer may be regarded as an insulator film according to the present invention, if the layer can act functionally as an insulator film. Similarly, when there is another layer between a wiring line and an interfacial roughness reducing film, the layer may be regarded as a wiring line according to the present invention, if the layer is functionally electroconductive and can act as part of the wiring line. Accordingly, when there is an electroconductive metal barrier layer between an interfacial roughness reducing film and a wiring line, the barrier metal layer may be regarded as part of the wiring line.

If effects of decreased leakage current and increased TDDB resistance, etc. can be achieved by satisfying the above-described structure, it is possible to consider that the effect of intervening of the interfacial roughness reducing film is achieved.

Figure 11:
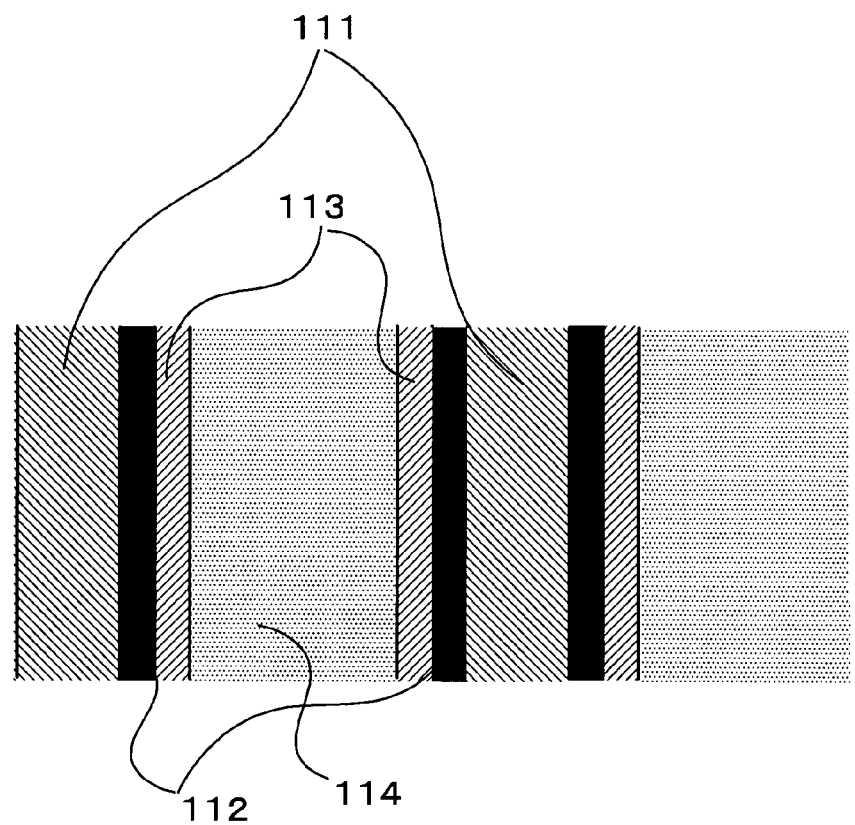
FIG. 11 is a schematic plan view showing an insulator film/interfacial roughness reducing film/wiring structure.
Figure 12:
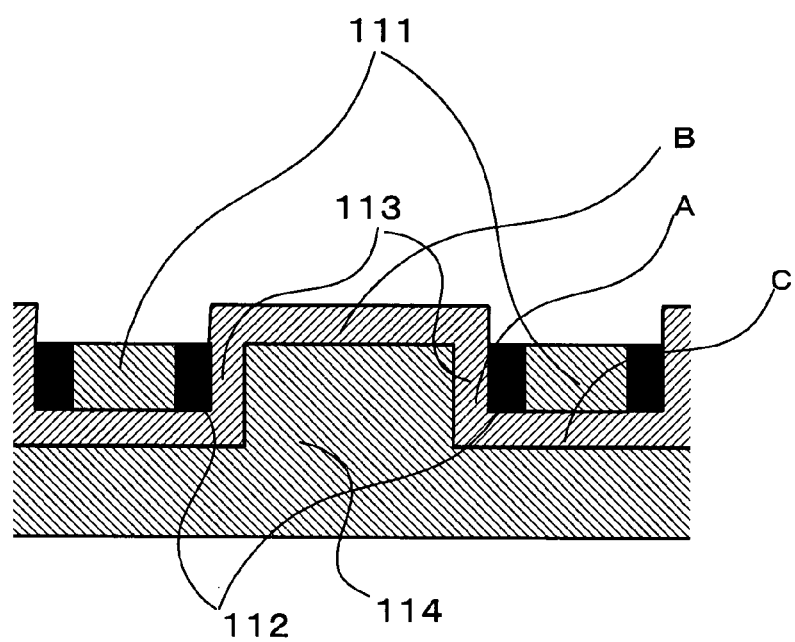
FIG. 12 is a schematic plan view showing an insulator film/interfacial roughness reducing film/wiring structure.

FIGS. 11 and 12 are concrete examples of an insulator film/interfacial roughness reducing film/wiring line structure. FIG. 11 is a plan view of an insulator film/interfacial roughness reducing film/wiring line structure, and FIG. 12 is a side cross-sectional view of the structure (in FIG. 11, the interfacial roughness reducing film on the insulator film is not shown). In FIG. 11, there are barrier metal layers 112 on both sides of a wiring line 111, an interfacial roughness reducing film 113 according to the present invention is present on both outer sides of the barrier metal layers 112, and an insulator film 114 with a rough surface is installed on both outer sides of the interfacial roughness reducing film 113. In FIG. 12, the wiring layer 111 is embedded in the insulator films 114, and the interfacial roughness reducing film 113 is formed at locations A, B and C in the figure.

The locations A and C are examples of an interfacial roughness reducing film in contact with an insulator film and also in contact with a wiring line the other side surface, according to the present invention. At B, a film that may be an interfacial roughness reducing film is installed on the insulator film. If a wiring line is installed thereon, it can act as an interfacial roughness reducing film according to the present invention. However, in general, surface smoothing treatment by CMP (Chemical Mechanical Polishing) is applied to remove the location B itself. Here, it is to be noted that this example shows a state in which there is no interfacial roughness reducing film on the upper side of the wiring layer 111 and barrier metal layers 112.

The reason of achieving the effect of the present invention in the cases of locations A and C is considered to be that increase in the leakage current due to electric field convergence or the like caused by damage such as a roughened surface and fine cracks of the insulator film, degradation in TDDB properties due to roughened wiring grooves, etc. can be prevented probably by the flatter surface of the interfacial roughness reducing film in contact with the wiring lines compared with the surface of the insulator film supposing it is in contact with the wiring lines (this corresponds to the interfacial roughness between the insulator film and the interfacial roughness reducing film). By this, the leakage current from the wiring lines is decreased, and it is possible to obtain a wiring layer (LSI wiring layer, for example) with a high TDDB resistance, and as a result, it is possible to manufacture a highly reliable semiconductor device with a small electric power consumption. Here, it is to be noted that the "wiring layer" according to the present invention means a layer containing a wiring structure, and layers containing elements (an insulator film, interfacial roughness reducing film, barrier metal layer, etc., for example) other than the wiring lines in the same plane as shown in FIGS. 11 and 12 are the examples.

An insulator film according to the present invention means a film used for the purpose of providing insulation between conductors, no matter whether it is specifically called an "insulator film" or not. Specifically, an interlayer insulation film, insulator film for wiring separation, and protective film for them (a stopper film to determine the end point of CMP, for example) of a semiconductor device are the examples. There is no particular limit on the film thickness. There is also no particular limit on the location where it is used.

There is no particular limit on the material used for the insulator film in the present invention, and it can be appropriately selected from among known materials. Those which can form an insulator film with a low dielectric constant are preferable, since the present invention is particularly suitable for applications in which the distance between two wiring lines is 1 μm or less. More specifically, insulator films having a low relative dielectric constant of 2.7 or less are preferable, and those having a relative dielectric constant of 2.5 or less are more preferable. Generally, when the relative dielectric constant of an insulator film is smaller than about 2.7, the insulating properties and reliability of the insulator film tend to be degraded sharply. The present invention is accordingly particularly useful in such a case.

An insulator film with a low dielectric constant of not more than 2.5 can be obtained by applying to a substrate for processing a liquid composition comprising an organosilicon compound obtained by hydrolysis of one or more in combination of silane compounds represented by the following formulae (5) to (8), in the presence of tetraalkylammonium hydroxide; subjecting the coating film of the liquid composition applied onto the substrate for processing to heat processing at a temperature not less than 80 and not more than 350° C.; and baking the formed coating film at a temperature higher than 350 and not more than 450° C., $$Si(OR^{11})_4 \quad (5)$$

$$X^1Si(OR^{12})_3 \quad (6)$$

$$X^2X^3Si(OR^{13})_2 \quad (7)$$

$$X^4X^5X^6SiOR^{14} \quad (8)$$

(in formulae (5) to (8), $X^1$-$X^6$ are, each independently, selected from the group consisting of a hydrogen atom, a fluorine atom, an alkyl group having a carbon number of 1 to 8, a fluorine-substituting alkyl group, an aryl group and a vinyl group; and $R^{11}$-$R^{14}$ are, each independently, a group selected from the group consisting of an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20.) Therefore, specifically, use of such an insulator film is preferable.

The low dielectric constant film thus obtained is often superior in mechanical strength, insulating properties, and reliability to other low dielectric constant films on the same dielectric constant level, and may contribute to the formation of wiring layers (LSI wiring layers, for example) with higher insulating properties and reliability.

There is no particular limit on the material used for the wiring line according to the present invention, and it may be appropriately selected from among known materials such as copper, aluminum, gold, platinum, etc.

It is preferable that the interfacial roughness reducing film according to the present invention has been installed after a treatment accompanied by surface roughening of the insulator film. Any treatment may be included as the treatment accompanied by surface roughening as long as the surface is roughened by the treatment. Specifically, operations such as etching which scrapes the insulator film may be included. CMP which is usually considered to be a treatment to make the surface smooth may also considered to belong to the category of treatments which are accompanied by surface roughening, to the extent that the condition that the interfacial roughness between the wiring line and interfacial roughness reducing film is smaller than that between the insulator film and interfacial roughness reducing film is satisfied.

Because an insulator film after such a processing may have a roughened surface also with possible damage such as fine cracks, etc., increase in leakage, degradation in TDDB properties due to wiring groove roughness, etc. will occur, and can be major causes of lower yield and lower reliability in the manufacture of semiconductor devices. In such a case, installation of an interfacial roughness reducing film makes the surface roughness of the side of the surface roughness reducing film that does not contact with the insulator film smaller compared with the interfacial roughness in a case in which the insulator film is in direct contact with the wiring line. The direct contact of the wiring line with the damage such as fine cracks generated on the insulator film surface is also avoided. Therefore, the leakage current from the wiring is diminished, LSI wiring layers with a high TDDB resistance can be obtained, and accordingly, it is possible to manufacture semiconductor devices with a small electric power consumption and a high reliability.

The thickness of an interfacial roughness reducing film may be arbitrarily decided depending on the actual situations (more specifically, from the viewpoint of how much of the surface roughness and the fine damage of the insulator film can be reduced). Generally, the average film thickness is preferably in the range of 0.1 to 50 nm. When it is less than 0.1 nm, the roughness absorption effect is often inadequate. When it is more than 50 nm, no particular improvement is expected in many cases. There is also a possibility that troubles would occur such as increase in resistance of vias and increase in the effective dielectric constant of the wiring layer due to filling into the via holes.

There is no particular limitation on the material for forming an interfacial roughness reducing film according to the present invention, as long as the film satisfies the functions-required for an insulator film, since it also comes to function as part of the insulator film. It is preferable that the material comprises silicon and oxygen, or silicon and carbon, or silicon and oxygen and carbon (that is, the material comprises silicon, and further at least one of oxygen and carbon), and more specifically, it is preferable that the material comprises at least one of an SiO skeleton and SiC skeleton. It is because required insulating properties (particularly low dielectric constant) are easily obtained.

Still more specifically, it is preferable to use, as a material for forming an interfacial roughness reducing film, a material comprising a silicon compound that satisfies at least one of a condition of having an average molecular weight of not more than 1,000, and another condition of having 20 or less silicon atoms in a molecule. It is because an interfacial roughness reducing film with a desirable film thickness can be easily formed. If the average molecular weight is more than 1,000 and/or the number of silicon atoms in a molecule is more than 20, other properties of the interfacial roughness reducing film will be often degraded, including a larger film thickness and larger dielectric constant.

Those selected from the group consisting of an organosilane, a hydrolysate of an organosilane, a condensate of an organosilane and a mixture thereof are preferable examples of such a silicon compound. The condensates are often obtained through hydrolysis. Specifically, dimers and oligomers are examples of the condensates. However, it is not necessary to identify the condensate specifically. Known techniques may be available for the hydrolysis and condensation.

When these agents are used, the free surface of an interfacial roughness reducing film can be made flatter, compared with the interface with an insulator film, when the interfacial roughness reducing film is formed on the insulator film. That is, when a layer is formed on the surface of an insulator film using these agents, the roughness of the free surface of the film is smaller than that of the interface with the insulator film. Therefore, if a wiring line is formed in contact with the free surface, the roughness of the interface with the wiring line becomes smaller than that of the interface with the insulator film. Fine damage can also be repaired. Accordingly, if wiring lines are installed to form structures of any of A to C in FIGS. 11 and 12 on the interfacial roughness reducing film, an "interfacial roughness reducing film in contact with an insulator film and also in contact with a wiring line on the other side surface thereof, wherein the interfacial roughness between the wiring line and the interfacial roughness reducing film is smaller than that between the insulator film and the interfacial roughness reducing film" can be obtained.

An interfacial roughness reducing film can be usually obtained by applying a material for forming an interfacial roughness reducing film in contact with an insulator film, and then, subjecting to a heat treatment the insulator film on which the material for forming an interfacial roughness reducing film is placed. Afterwards, wiring lines are formed in contact with the interfacial roughness reducing film. The heat treatment is preferably carried out at a temperature of from 80 to 500° C. for 0.5 to 180 minutes.

There are cases in which wiring lines are also exposed together with an insulator film, and accordingly, a material for forming an interfacial roughness reducing film is also applied to the wiring lines when it is applied in contact with the insulator film. However, since it can be easily removed afterwards by baking or the like, or easily removed by washing or the like, there is little possibility that the material makes an obstacle in electrically connecting the wiring layer with other conductors (such as vias). Thus, troubles of increased wiring resistance and via contact resistance are expected to be rare.

This is because when a material for forming an interfacial roughness reducing film is applied to an insulator film surface which has been subjected to etching and/or CMP, if a silicon-containing compound is used for the insulator film, the material for forming an interfacial roughness reducing film can be reacted with silanol groups generated on the surface of the insulator film, forming a strong film, while the film does not react with a material such as copper for the wiring, even if copper wiring lines or the like are present during the application, and accordingly, it is easily removed. In this way, an interfacial roughness reducing film can be formed selectively on an insulator film.

There is no particular limitation on the way of forming an interfacial roughness reducing film on the surface of an insulator film, and it can be appropriately selected from the known methods. Specifically, applications such as spraying, spin coating and vapor treatment are the examples. Vapor treatment means introducing a material for forming an interfacial roughness reducing film onto an insulator film in the above-described state. Specifically, any known method may be employed such as placing the system in vacuum, heating the system if necessary, and making a carrier gas entrain a vapor material for forming an interfacial roughness reducing film.

This heat treatment after the application is preferably carried out in an atmosphere that does not contain oxygen, for example, in a nitrogen atmosphere. This atmosphere that does not contain oxygen is more preferably kept for an appropriate period after the application until the heat treatment is completed. It is because it is possible to prevent the increase of the dielectric constant of the interfacial roughness reducing film caused by the presence of oxygen or the like. How little oxygen should be present may be determined appropriately, depending on the actual situations.

A material for forming an interfacial roughness reducing film usually contains a solvent. The solvent may be one which was present with an organosilane, or one which has been used in the hydrolysis and/or condensation, and which has come to be present with the hydrolysate and/or condensate.

There is no particular limitation on the type of this solvent, and it may be appropriately selected from known solvents. If a solvent that is the same substance as a component contained in a product obtained by hydrolyzing an organosilane is used, it is possible to prevent further hydrolysis of the organosilane, and it is also possible to prevent further polymerization of the hydrolyzed organosilane. It is also advantageous in view of the ease of later recovery of the solvent.

It is preferable that the total amount of the organosilane, hydrolysate of an organosilane and condensate of an organosilane is not more than 5% by mass in the material for forming an interfacial roughness reducing film. If the concentration is more than that, the formed roughness reducing film turns thicker, making it impossible to accomplish other properties such as low dielectric constant required for the wiring layer. Here, it is to be noted that the materials contained in the material for forming an interfacial roughness reducing film other than the whole of the organosilane, and hydrolysates and condensates thereof, may include by-products generated at the hydrolysis and condensation as well as solvents.

Preferable organosilanes are those represented by any of the following formulae (1) to (4), and (1')

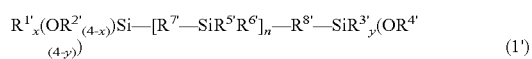

(in formulae (1) to (4), $R^1$-$R^{10}$ are, each independently, a group selected from the group consisting of an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20, and in formulae (1') $R^{1'}$-$R^{6'}$ are, each independently, a group selected from the group consisting of hydrogen, an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20, R7' and R8' are, each independently, a hydrocarbon group having a carbon number of 1 to 20, n is an integer of 0 to 18, and x and y are each independently, an integer of 0 to 4.)

These agents can be easily converted to hydrolysates, condensates and mixtures thereof. Accordingly, by using these agents, hydrolysates, condensates and mixtures thereof, an interfacial roughness reducing film that provides the above-described effects can be easily manufactured.

It is more preferable that $R^1$-$R^{10}$ in formulae (1) to (4) are, each independently, a group selected from the group consisting of an alkyl group having a carbon number of 1 to 3; an alkenyl group, an alkynyl group, and an alkylcarbonyl group having a carbon number of 2 to 4; an alkenylalkyl group and an alkynylalkyl group having a carbon number of 3 to 6; and an aryl group having a carbon number of 6 to 10. It is also more preferable that $R^{1'}$-$R^{6'}$ in formulae (1') are, each independently, a group selected from the group consisting of an alkyl group having a carbon number of 1 to 3; an alkenyl group, an alkynyl group, an alkylcarbonyl group having a carbon number of 2 to 4, an alkenylalkyl group and an alkynylalkyl group having a carbon number of 3 to 6; and an aryl group having a carbon number of 6 to 10, and R7' and R8' are, each independently, a hydrocarbon group having a carbon number of 1 to 3. This is because a higher effect is achieved with improved hydrophobic properties, electric properties, strength, etc. of the interfacial roughness reducing film.

It is preferable that the above-described material for forming an interfacial roughness reducing film has a pH in the range of 4 to 10 in the state of use. Out of the range, polymerization of the material advances, the formed interfacial roughness reducing film will be thicker, making it impossible to accomplish other properties such as low dielectric constant required for the wiring layer. When it is not possible to determine the pH in the state of use, it is not possible to apply this condition. However, since water and/or alcohol is generally contained in a material for forming an interfacial roughness reducing film, it is possible to determine the pH. pH is determined at ordinary temperature.

Any method may be employed as the method for manufacturing a semiconductor device using a material for forming an interfacial roughness reducing film according to the present invention, as long as the above-described conditions are satisfied. Specifically, it is sufficient if it comprises: applying the above-described material for forming an interfacial roughness reducing film in contact with an insulator film of the semiconductor device; and then, forming an interfacial roughness reducing film by heating the semiconductor device at a temperature of from 80 to 500° C. for 0.5 to 180 minutes. Here, it is to be noted that the "semiconductor device" in this case includes a semiconductor device during the manufacturing. Less than the lower limits, solidification and hardening of the interfacial roughness reducing film may be insufficient. More than the upper limits, no particular effects are achieved in many cases.

By including such a heat treating process, it is possible to accelerate the reaction between the insulator film and the material for forming an interfacial roughness reducing film, and accordingly, to obtain wiring lines with a higher reliability and with less leak current from between the wiring lines.

The insulator film preferably has a silanol group, because the reaction is further accelerated. The insulator film is also preferably one which has been subjected to a treatment accompanied by roughening of the surface because of the above-described reasons.

Desirable requirements for the material for an interfacial roughness reducing film, application method, film thickness, atmosphere in a system during the application, type of the insulator film, relative dielectric constant, etc. of an interfacial roughness reducing film, are as described already.

In this way, it is possible to form an "interfacial roughness reducing film in contact with an insulator film and also in contact with a wiring line on the other side surface thereof, wherein the interfacial roughness between the wiring line and the interfacial roughness reducing film is smaller than that between the insulator film and the interfacial roughness reducing film", using a material for an interfacial roughness reducing film according to the present invention, and further obtain a wiring layer with a high TDDB resistance and little leakage current. By using such a wiring layer, it is possible to manufacture a highly reliable semiconductor device with a small electric energy consumption. The present invention can be favorably applied to highly integrated semiconductor devices such as ICs and LSIs.

The material for forming an interfacial roughness reducing film by the present invention can be favorably and effectively applied to practical manufacturing of semiconductor devices, particularly by comprising steps of:

(I) forming grooves for wiring and via holes in a semiconductor device by etching; then, (II) forming an interfacial roughness reducing film; and then, (III) forming a barrier metal layer.

Specifically it is possible to reduce the roughness of the grooves for wiring caused by etching, and to form a more highly reliable LSI wiring layer that has less leakage from between the wiring lines.

EXAMPLES

In the following, EXAMPLES and a COMPARATIVE EXAMPLE will be described in detail.

Example 1

A coating-type low dielectric constant insulating material comprising a silicon-containing compound and having a low relative dielectric constant of 2.5 was applied onto a low-resistant substrate to a thickness of 250 nm by spin coating, the substrate was subjected to prebaking at 250° C. for three minutes, and then, cured in an electric oven under a nitrogen atmosphere at 400° C. for 30 minutes. Afterwards, etching was performed on the whole surface to a depth of 200 nm.

A sample which had not been subjected to any other treatment in the later stage was called sample 1; a sample which had been subjected only to baking at 250° C. for 1 minute without any spin coating was called sample 2; a sample which had been subjected only to spin coating with HMDS (hexamethyldisilazane) was called sample 3; a sample which had been subjected to spin coating with HMDS, followed by baking at 250° C. for 1 minute was called sample 4; a sample which had been subjected to spin coating with a material for forming an interfacial roughness reducing film obtained by dissolving 1,3-dimethyltetraethoxydisiloxane (DTDS) in a 1% by mass of an ethanol solution followed by adjustment of the average molecular weight to 1,000 or less, and then to baking at 250° C. for 1 minute was called sample 5; a sample which had been subjected to spin coating with a material for forming an interfacial roughness reducing film obtained by dissolving bis(triethoxysilyl)methane (BTSM) in a 1% by mass of an ethanol solution followed by adjustment of the average molecular weight to 1,000 or less, and then to baking at 250° C. for 1 minute was called sample 6; and a sample which had been subjected to spin coating with a material for forming an interfacial roughness reducing film obtained by dissolving bis(triethoxysilyl)ethane (BTSE) in a 1% by mass of an ethanol solution followed by adjustment of the average molecular weight to 1,000 or less, and then to baking at 250° C. for 1 minute was called sample 7. Furthermore, a sample in which the above-described coating-type low dielectric constant insulating material had been coated to a thickness of 200 nm in the same way as above, followed by curing at 400° C. for 30 minutes but without further treatments was called sample 8. In the heat treatment, the system was kept under a nitrogen atmosphere. The numbers of silicon atoms included in the molecules of sample 5 and 6 are not more than 20 in one molecule, respectively. The structures of BTSM and BTSE correspond to formula (1').

Using a metal mask, gold was deposited in a film thickness of 100 nm on the insulator film surfaces of the above-described samples 1-8, and the electric field—electric current properties were determined. TABLE 1 shows the current density J ($A/cm^2$) properties of the thus obtained films at 0.1 MV/cm and 1 MV/cm. The electric field—electric current properties were determined, using the Precision Semiconductor Parameter Analyzer (4156C, Agilent Technologies). In addition, the surface contour measurement of the surfaces of the above-described samples 1-8 was carried out. A probe microscope (SPM-9500, Shimazu Corporation) was used for the measurement. TABLES 1 shows Ra's of the obtained surfaces.

From these results, it is understood that samples 6 and 7 provide greatly reduced roughness, and current density properties on the same level as a case without any etching (sample 8). Improvement was also observed with sample 5. It is considered that the fact that HMDS did not give a good result is because HMDS did not reduce the roughness although it improved the surface.

It is to be noted that the material for forming an interfacial roughness reducing film obtained by dissolving bis(triethoxysilyl)methane (BTSM) and bis(triethoxysilyl)ethane (BTSE) respectively in a 1% by mass of an ethanol solution followed by adjustment of the average molecular weight to 1,000 or less, had a pH of 6, and the interfacial roughness reducing film of samples 5 to 7 had a film thickness of 5 nm. No films were formed from samples 3 and 4. The presence of Si—O skeleton in samples 5-7 and the presence of Si—C skeleton in samples 6 and 7 were confirmed by FT-IR (Fourier transform infrared spectroscopy).

TABLE 1

| Sample | Material | J@0.1 MV/cm | J@1 MV/cm | Ra (nm) |
|---|---|---|---|---|
| 1 | None | $2 \times 10^{-7}$ | $7 \times 10^{-1}$ | 10.1 |
| 2 | Baking | $2 \times 10^{-9}$ | $2 \times 10^{-6}$ | 9.5 |
| 3 | HMDS | $3 \times 10^{-9}$ | $7 \times 10^{-6}$ | 9.7 |
| 4 | HMDS + Baking | $1 \times 10^{-10}$ | $7 \times 10^{-8}$ | 9.8 |
| 5 | DTDS + Baking | $1 \times 10^{-10}$ | $3 \times 10^{-10}$ | 3.4 |
| 6 | BTSM + Baking | $1 \times 10^{-10}$ | $3 \times 10^{-10}$ | 0.86 |
| 7 | BTSE + Baking | $1 \times 10^{-10}$ | $3 \times 10^{-10}$ | 0.91 |
| 8 | No etching | $1 \times 10^{-10}$ | $3 \times 10^{-10}$ | 0.53 |

Example 2

FIGS. 1-10 show how an example of a multilayer wiring structure according to the present invention is manufactured. First, on a silicon wafer 1 on which formed was a transistor layer having a gate electrode 4 with a source diffusion layer 5a, drain diffusion layer 5b and sidewall insulator film 3 (step 1) and being separated by an element separation film 2, an interlayer insulation film 6 (phosphorus glass) and a stopper film 7 were formed (step 2), and then, a contact holes 21 for leading to electrodes were formed (step 3).

TiN 8 in a thickness of 50 nm was formed in these contact holes by a sputtering method (step 4). A mixture of $WF_6$ and hydrogen was then reduced to form (fill in) conductor plugs 9 (step 5), the part other than via holes 25 was removed by CMP (step 6). Subsequently, a low dielectric constant coating (insulator film for wiring separation) 10 was formed so that the surface of the coating was 250 nm over the silicon wafer plane, followed by lamination of TEOS-$SiO_2$ 11 as a protective film for the interlayer insulation film in a thickness of 50 nm (step 7).

This film was processed with a F plasma from a $CF_4/CHF_3$ gas as a raw material, using a resist layer having the first-layer wiring pattern as a mask, to form wiring grooves 22 (step 8). The same process as for sample 5 in EXAMPLE 1 was carried out into these grooves 22 to form an interfacial roughness reducing film 12 (step 9).

Furthermore, TiN 8 in a thickness of 50 nm which was to act as a barrier metal against Cu into the insulator film, and a seed layer 23 (Cu, 50 nm) which was to act as an electrode during the electrolytic plating were formed into the wiring grooves by sputtering (step 10). After the step, a Cu layer 17 was overlaid in a thickness of 600 nm by electrolytic plating (step 11), and the metal other than the wiring pattern was removed by CMP to form a wiring layer 24 (step 12).

Next, the dual damascene method for forming a via layer and a wiring layer at the same time will be explained.

A cap layer 19 (SiN) was deposited on the first wiring layer in a thickness of 50 nm for the purpose of preventing Cu diffusion, and an SiOC film 13 was overlaid in a thickness of 250 nm which was formed by a plasma CVD method. For the wiring layer part, an SiN film 14 was deposited in a thickness of 50 nm as a stopper film by plasma CVD using a silane and an ammonia gas, a low dielectric constant insulator film 15 was formed so that the surface is 400 nm over the silicon wafer plane, and then TEOS-$SiO_2$ 16 was overlaid in a thickness of 50 nm as a protective layer for the interlayer insulation film (step 13).

An $SiO_2$ layer 16/low dielectric constant insulator film 15/SiN film 14/SiOC film 13/cap layer 19 structure was formed in this order by processing the insulator film using a F plasma from a $CF_4/CHF_3$ gas as a raw material with a resist layer having a via pattern as a mask and by changing the gas composition (step 14). The processing was further continued with a F plasma from a $CF_4/CHF_3$ gas as a raw material, using a resist layer having the second layer wiring pattern as a mask (step 15).

The same process as for sample 5 in EXAMPLE 1 was carried out into these via holes 30 and wiring grooves 26, an interfacial roughness reducing film 20 was formed, and TiN 8 in a thickness of 50 nm which was to act as a barrier metal against Cu into the insulator film, and a seed layer 27 (Cu, 50 nm) which was to act as an electrode during the electrolytic plating were formed into the via holes and wiring grooves by sputtering (step 16). After the step, a Cu layer 18 was overlaid in a thickness of 1,400 nm by electrolytic plating (step 17), and the metal other than the wiring pattern was removed by CMP to form vias 28 and a wiring layer 29 (step 18). The same steps were repeated to form a three-layer wiring structure. A TDDB measurement was conducted on the experimentally manufactured multi-layer wiring structure. In the TDDB measurement, a multi-layer wiring structure with a comb-shaped pattern was used, and a voltage of 3.3 MV/cm was applied to the teeth of the combs for determining the time until the breakdown. The median value until the breakdown was 220 seconds.

Example 3

A three-layer wiring structure was formed in the same way as in EXAMPLE 2, except that the interfacial roughness reducing films 12, 20 were made using sample 6 of EXAMPLE 1. The same TDDB measurement was conducted using the comb-shaped pattern for the experimentally manufactured multi-layer wiring structure. The median value until the breakdown was 426 seconds.

Example 4

A three-layer wiring structure was formed in the same way as in EXAMPLE 2, except that the interfacial roughness reducing films 12, 20 were made using sample 7 of EXAMPLE 1. The same TDDB measurement was conducted using the comb-shaped pattern for the experimentally manufactured multi-layer layer wiring structure. The median value until the breakdown was 409 seconds.

Comparative Example 1

The same procedure was employed as for EXAMPLE 2 to form a three-layer wiring structure, except that no interfacial roughness reducing films 12 and 20 were formed. An EM measurement was conducted as for EXAMPLE 2, using the comb-shaped pattern for the experimentally manufactured multi-layer wiring structure. The median value until the breakdown was 58 seconds.

What is claimed is:

1. A material forming an interfacial roughness reducing film, wherein:
    said interfacial roughness reducing film is in contact with an insulator film and also in contact with a wiring line on the other side surface thereof;
    the interfacial roughness between said wiring line and said interfacial roughness reducing film is smaller than that between said insulator film and said interfacial roughness reducing film; and
    said material comprises a silicon compound that satisfies at least one of a condition of having an average molecular weight of not more than 1,000, and another condition of having 20 or less silicon atoms in a molecule, wherein said silicon compound comprises a silicon—one or more carbons—silicon skeleton, and is selected from the group consisting of an organosilane, a hydrolysate of an organosilane, a condensate of an organosilane and a mixture thereof.

2. A material forming an interfacial roughness reducing film according to claim 1, wherein the surface of said insulator film in contact with said interfacial roughness reducing film is surface-roughened.

3. A material forming an interfacial roughness reducing film according to claim 1, said material comprising a solvent that is the same as a component contained in a product obtained by hydrolyzing said organosilane.

4. A material forming an interfacial roughness reducing film according to claim 3, wherein said organosilane is represented by formula (1'), or is a mixture represented by formula (1') and any of the following formulae (1) to (4),

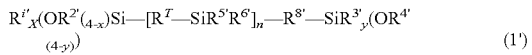

(in formulae (1) to (4), $R^1$-$R^{10}$ are, each independently, a group selected from the group consisting of an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20, and in formulae (1') $R^{1'}$-$R^{6'}$ are, each independently, a group selected from the group consisting of hydrogen, an alkyl group having a carbon number of 1 to 20; an alkenyl group, an alkynyl group, an alkylcarbonyl group, an alkenylalkyl group and an alkynylalkyl group having a carbon number of 2 to 20; and an aryl group having a carbon number of 6 to 20, $R^{7'}$ and $R^{8'}$ are, each independently, a hydrocarbon group having a carbon number of 1 to 20, n is an integer of 0 to 18, and x and y are each independently, an integer of 0 to 4.)

* * * * *